United States Patent [19]
Lwee et al.

[11] Patent Number: 5,830,014
[45] Date of Patent: Nov. 3, 1998

[54] ELECTRICAL CONNECTOR

[75] Inventors: Nai Hock Lwee; Loke Wing Kin; Ng Bee Suat, all of Singapore, Singapore

[73] Assignee: Berg Technology, Inc., Reno, Nev.

[21] Appl. No.: 436,309

[22] PCT Filed: Jul. 21, 1993

[86] PCT No.: PCT/US93/07064

§ 371 Date: Oct. 28, 1996

§ 102(e) Date: Oct. 28, 1996

[87] PCT Pub. No.: WO94/12311

PCT Pub. Date: Jun. 9, 1994

[30] Foreign Application Priority Data

Nov. 25, 1992 [JP] Japan ......................... 4/81224

[51] Int. Cl.[6] ..................................... H01R 9/09
[52] U.S. Cl. ............................. 439/876; 228/39
[58] Field of Search ............. 439/83, 876; 228/39, 228/180.1

[56] References Cited

U.S. PATENT DOCUMENTS 3,989,331 11/1976 Hanlon ...................... 439/876
4,010,992  3/1977 Crimmins .................. 439/876
4,872,845 10/1989 Korsunsky ................. 439/70

*Primary Examiner*—Neil Abrams
*Attorney, Agent, or Firm*—Woodcock Washburn Kurtz Mackiewicz & Norris LLP

[57] ABSTRACT

The present invention provides a vertical card connector capable of preventing an undesirable flow of melted solder which destroys proper contacts and of removing a corrosion-causing acid gas. The vertical card connector includes an insulating housing with a plurality of contact terminals and a heat-resisting insulating resin film covering the bottom surface of the housing. The solder tail of the contact is inserted into a corresponding plated through hole and soldered there. The film prevents melted solder from flowing past the solder tail toward a contact beam of the contact at the time of soldering. Gas produced from the solder escapes through the gap between the circuit board and the bottom of the housing.

14 Claims, 2 Drawing Sheets

ELECTRICAL CONNECTOR

BACKGROUND OF THE INVENTION

1. Field of the Invention

The present invention relates to an electrical connector for connecting a circuit board. In particular, the invention relates to a connector housing which improves soldering of its terminal connectors to the circuit board.

2. Description of the Related Art

A mother board has a plastic connector housing on its surface side for a conventional vertical card connector. The mother board is connected to a daughter card via vertically inserted plugs in the plastic connector housing at the edge of the daughter card. Contact terminals are located in the housing, and each contact terminal has a contact beam for making electrical contact with a corresponding plug of the daughter card. Each contact terminal also includes a solder tail to be soldered to the mother board. Basic functions of the contact beam are to receive the daughter card plug for making an electrical connection and holding the plug in place.

One known process for mounting such a connector on the mother board is as follows: The solder tail of the contact terminal is inserted into a corresponding through hole of the mother board. The mother board is inverted so that the housing is set on a "down" side and the solder tails on an "up" side. The solder tails are soldered to the mother board by applying melted solder to the solder tails on the soldering side of the mother board.

During the above steps, since an amount of melted solder flowing onto the solder tail is not controlled, more than necessary melted solder may be supplied to the solder tail. Melted solder will flow down the solder tail into the mother board and toward the plastic connector housing. Melted solder may also flow inside the connector reaching the contact beam. In such a situation, excess solder narrows the plug receiving gap in the connector terminal. Ultimately, the excess solder will impair a basic function of the connector terminal by not fitting a plug.

Another prior-art process for mounting the aforementioned connector on a mother board is as follows: The solder tail of the contact terminal is inserted into a through hole of the mother board. The mother board and connector terminal pass through a wave soldering machine while the mother board is held in such a way that the solder tail faces downwards. The wave soldering machine forces melted solder to go upward from the bottom of the connector terminals towards the connector housing through the mother board. Since the connector terminal is very short, pressure acting upon the melted solder causes the solder to penetrate into the connector housing. As a result, the melted solder still may reach the contact beam and impair the basic function of the contact beam.

SUMMARY OF THE INVENTION

Accordingly, it is an object of the present invention to provide an electrical connector which can solve the aforementioned problems which are inherent in the existing electrical connectors. Thus, an object of the invention is to provide an electrical connector which can prevent any undesired flow of solder upon soldering.

According to one aspect of the present invention, an electrical connector is provided which connects a plurality of plugs to a circuit board with a plurality of bores. The electrical connector comprises a housing which has a first surface that is mountable to the circuit board and a second surface opposed to the first surface. A plurality of spaces extends from the first surface to the second surface of the housing to receive corresponding plugs. A plurality of contact terminals is located in the spaces for establishing an electrical connection with the plugs. Each contact terminal has a corresponding solder tail inserted into the bore in the circuit board and extends through of the first surface of the housing so as to allow soldering to be effected to the circuit board. A heat-resisting insulating resin sheet covers the first surface of the housing. There is a first gap between the circuit board and the heat-resisting insulating resin sheet. The solder tail of the contact terminal extends through the sheet.

A first gap is created between the heat-resisting insulating resin sheet and the circuit board so as to allow an acid gas which is evolved due to a flux during soldering to escape from the gap.

According to another aspect of the invention, a second gap is provided between the heat-resisting insulating resin sheet and the first surface of the housing. The second gap together with the first gap substantially improves evaporation of water-based washing liquid after washing assembled circuit boards.

According to the aforementioned electrical connector, a flow of excess melted solder onto an area of contact between the housing-mounted circuit board and the first surface of that housing is prevented by the heat-resisting insulating resin sheet covering the first surface of the housing.

Additional objects and advantages of the invention will be set forth in the following description. The objects and advantages of the invention may be realized and obtained by means of the instrumentalities and combinations particularly pointed out in the appended claims.

BRIEF DESCRIPTION OF THE DRAWINGS

The accompanying drawings which are incorporated in and constitute a part of the specification illustrate a presently preferred embodiment of the invention. Together with the general description given above and the detailed description of the preferred embodiment given below, the drawings serve to explain the principles of the invention.

DETAILED DESCRIPTION OF THE PREFERRED EMBODIMENT

Figure 1:
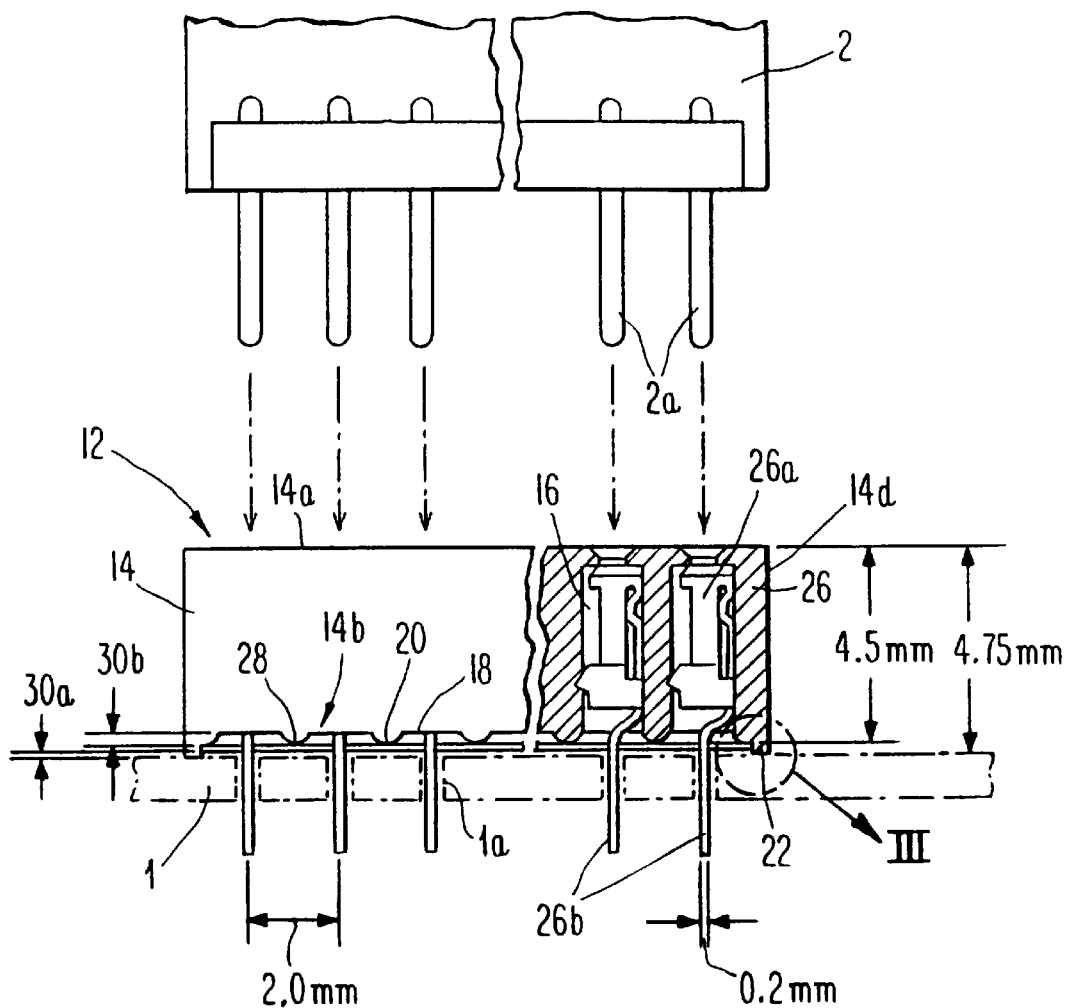
FIG. 1 illustrates a side view of an electrical connector according to an embodiment of the present invention.

Referring to FIG. 1, an electrical connector or vertical card connector 12 connects a printed circuit board 1 to a printed circuit board 2 in a substantially vertical relation. The connector 12 has an elongated housing 14 in which a plurality of contact terminal receiving spaces 16 are provided. The housing 14 is made of a material having a desired electrical insulating property such as a glass-filled PBT.

Each contact terminal receiving space 16 extends from an upper surface 14a to a bottom surface 14b of the housing 14.

Figure 2:
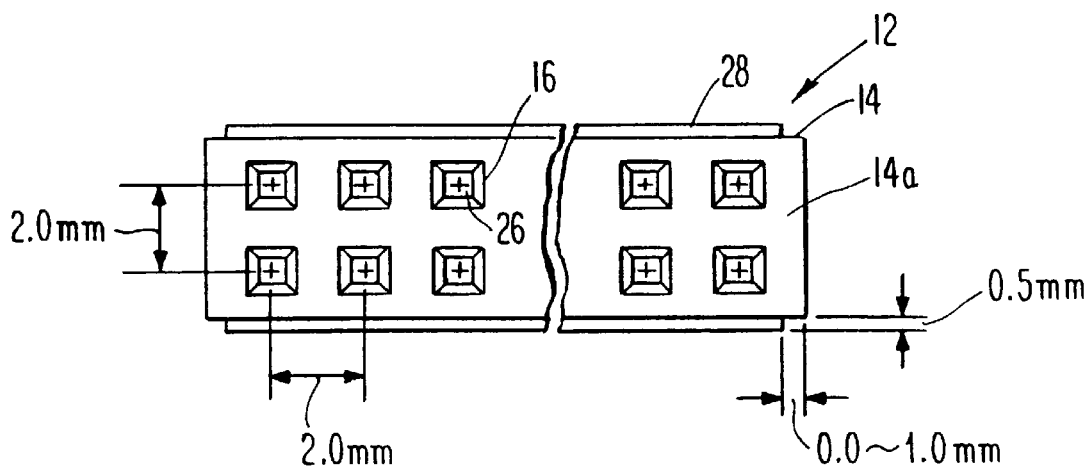
FIG. 2 shows a top view of the electrical connector shown in FIG. 1.

As shown in FIG. 2, the contact terminal receiving spaces 16 are arranged in a parallel array as seen on the upper surface 14a of the housing 14.

Referring back to FIG. 1, a plurality of recesses 18 is provided across the bottom surface 14b of the housing 14 which coincides the array of contact terminal receiving spaces 16. A first ridge or projection 22 is provided at each end of the bottom surface 14b of the housing 14. A plurality of second ridges or projections 20 are provided at each end of the recess 18 including at the both ends of the bottom surface 14b of the housing 14. The first ridge 22 adds an additional height to the second ridge 20.

Figure 3:
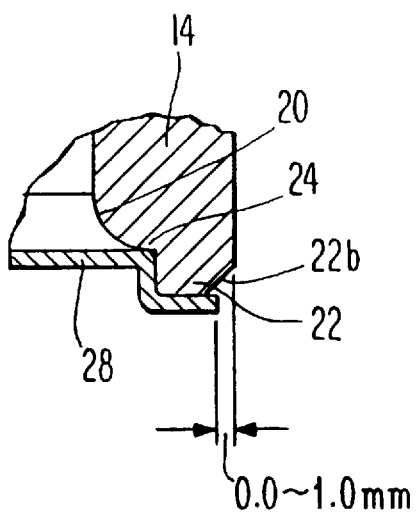
FIG. 3 shows an enlarged portion of a connector indicated by III in FIG. 1.

FIG. 3 shows an enlarged cross-section of the second ridge 20 and the first ridge 22 at the end of the housing 14. An inner wall 22a of the first ridge 22 is made substantially vertical to the bottom surface 14b of the housing 14. The inner wall 22a of the first ridge 22 merges with the second ridge 20 at each end of the housing 14. A shoulder 24 is provided at a merging area between the second ridge 20 and the inner wall 22a of the first ridge 22. The shoulder 24 is projected relative to the recess 18 as much as other second ridges 20 are. An outer wall 22b of the first ridge 22 is rounded toward the inner wall 22a side of the first ridge 22.

According to one embodiment, the housing 14 has a width of 4.2 mm and a height of 4.5 mm between the second ridge 20 and the upper surface of the housing 14. The first ridge 22 adds 0.25 mm in height beyond the second ridge 20. Thus, the housing 14 has a total height of 4.75 mm between the first ridge 22 and the upper surface of the housing 14.

A female contact terminal 26 is placed in a contact terminal receiving space 16 as shown in FIGS. 1 and 2. The contact terminal 26 is of a conventional type for a conventional vertical connector. Each contact terminal 26 is formed of a sheet metal such as phosphor bronze having desired conductive and elastic properties. The contact terminal 26 has a contact beam 26a for establishing electrical contact with a plug 2a of a daughter card 2. A solder tail 26b is inserted into a plated bore 1a on the mother board 1 and is soldered therein. The contact beam 26a substantially extends from the upper surface 14a to the bottom surface 14b of the housing 14 while the solder tail 26b extends vertically from the bottom surface 14b of the housing 14 through the bore 1a to the other side of the mother board 1. The contact beam 26a may take various shapes whereby it is possible to hold the plug 2a of a daughter card 2 in place with an elastic action. Since the form of the contact beam 26a is known in the "contact" field of art, any detailed explanation is omitted.

Figure 4:
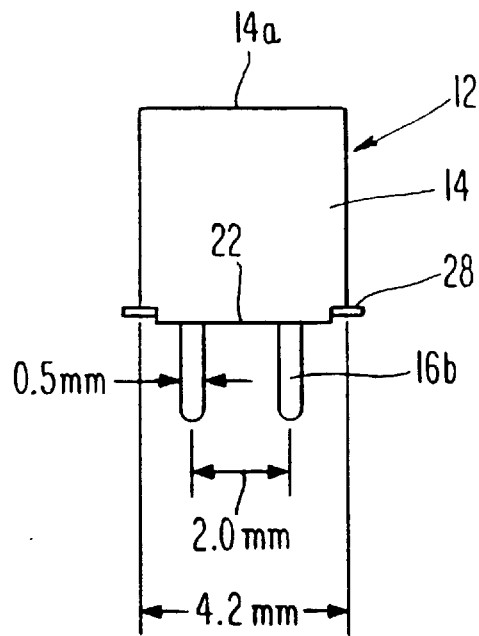
FIG. 4 shows an end view of the electrical connector of FIG. 1.
Figure 5:
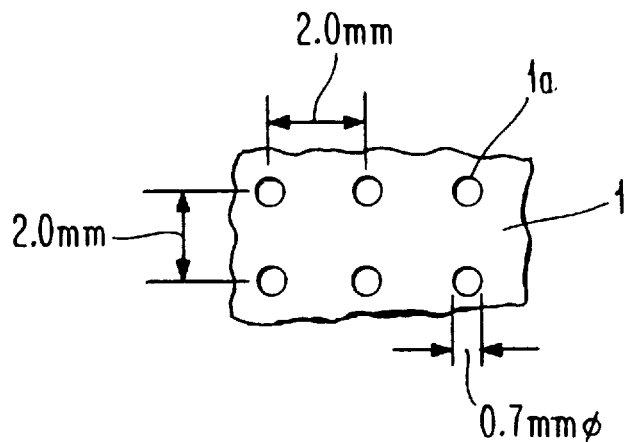
FIG. 5 shows a top view of a layout of plated through holes in a mother board of FIG. 1.

As shown in FIGS. 2 and 4, in a preferred embodiment, each solder tail 26b is approximately 0.2 mm as viewed along the length of the housing 14 and 0.5 mm as viewed along the width of the housing 14. The array pitch of the contacts 26 is 2 mm×2 mm as shown in FIGS. 2 and 5. According to a preferred embodiment, the plated bores 1a of the mother board 1 are so arranged to accept the solder tails 26b as shown in FIG. 5. The plated bore 1a has a diameter of 0.7 mm, and the mother board 1 has a thickness of 0.9 mm to 1.3 mm.

As shown in FIGS. 1 and 4, the bottom surface 14b of the housing 14 is covered with a sheet, tape or film 28 which is made of a heat-resisting insulating resin. The solder tail 26b extends through or pierces the film 28.

The insulating resin material in the film 28 has a high melting point so that it does not melt when melted solder contacts its surface. One heat-resisting insulating film which is particularly suited for this purpose is a polyamide film known under the trade mark "Kapton," manufactured by E. I DuPont de Nemours & Company.

The film 28 extends along the peaks of the second ridges 20 in the housing 14. At the end of the housing, end portions the film 28 are bent substantially perpendicularly and covers along the inner wall 22a of the first ridge 22 at the shoulder 24. The film 28 is then again bent substantially perpendicularly at the forward end of the inner wall 22a toward the outer wall 22b of the first ridge 22 as shown in FIG. 3. Since, as discussed above, the extension length of the first ridge 22 beyond the second ridge 20 is approximately 0.25 mm, the film 28 is placed 0.25 mm inside the bottom surface defined by the top of the first ridge 22. Here, the film 28 is very thin on the order of 0.025 mm even though it is shown out of proportion with respect to other elements in figures.

The film 28 extends beyond an edge of the housing. The horizontal distance between the end of the film 28 and the longitudinal end of the housing 14 ranges from 0 to 1.0 mm according to one embodiment as shown in FIG. 3. The width of the film 28 is 43 mm while the width of the housing is 42 mm. The width of the film 28 is 0.5 mm greater at each side of the housing 14 as shown in FIG. 2. The excess portions of the film 28 makes the manufacturing process easier, and the size of the film 28 is not restricted only to the aforementioned size.

The film 28 serves as a barrier during a soldering step of the solder tail 26b. Melted solder is prevented from flowing into a recess 18, a contact terminal receiving area 16 or a contact terminal 26. In addition, according to the present embodiment, since the film 28 is placed at least 0.25 mm above the mother board, a first gap 30a is created between the bottom surface of the film 28 and the surface of the mother board. Further, due to the presence of the recess 18, a second gap 30b is created between the top surface of the film 28 and the bottom surface 14b of the housing 14. A better soldering bond is achieved since an acid gas evolved from a flux used for soldering the solder tail 26b escapes from the first gap 30a.

The experiments have revealed that when melted solder reaches the solder tails 26b and the plated bore 1a in the mother board, an acid gas evolving from the melted solder cannot escape from the solder and stays therein. This cannot satisfy a requisite solder filling specification. Further after time lapses, the acid gas fills in the housing 14, and the contact terminal 26 is corroded. This corrosion causes a connection failure. Thus, the gap substantially prevents the corrosion of the contact terminal by allowing the acid gas to escape. In addition, the gaps 30a and 30b also enable to readily evaporate water-based cleaning medium. When circuit board are assembled and soldered as described above according to the current invention, the circuit boards are washed with water-based cleaning medium to remove undesirable material on the board. Although non-water-based cleaning medium may be used, for the reasons of the cost and environmental concerns, more water-based cleaning medium is used these days. The gaps 30a and 30b together substantially improve the evaporation of the residual cleaning medium. Without these gaps, corrosion of the contact terminals due to the residual cleaning medium occurs.

Although, in the aforementioned embodiment, the dimension of each part of the electrical connector 12 has been explained by way of example, various design modifications can be made according to the present invention. Further, the electrical connector 12 to which the present invention is applied is not restricted to the vertical card connector 12. The current invention can also be applied to other electrical connectors which allow the insertion of a plurality of plugs.

As set out above, according to the present invention, the characteristic of the contact is not destroyed because the heat-resisting insulating resin sheet prevents a melted solder from flowing past the solder tails into the housing when the solder tail of the contact is soldered. An undesirable acid gas evolving from the solder is removed by the gap created by the projection.

Additional advantages and modifications may be available by those skilled in the art. Therefore, the invention in its broader aspects is not limited to the specific details and representative devices shown and described herein. Accordingly, various modifications may be made without departing from the spirit or scope of the general inventive concept as defined by the appended claims and their equivalents.

What is claimed is:

1. An electrical connector for connecting a first circuit board with through holes to a second circuit board via a plurality of contact terminal pins, comprising:

a housing located on said first circuit board, said housing having a bottom surface and a top surface, said plurality of contact terminal pins located at said bottom surface of said housing and placed in said through holes of said first circuit board;

a heat-resisting insulating resin sheet located between said bottom surface of said housing and said first circuit board for preventing excess solder from entering into said housing when melted solder is applied to said contact terminal pins; and a first projection located on said bottom surface of said housing for creating a first space between said heat-resisting insulating resin sheet and said first circuit board;

wherein said heat-resisting insulating resin sheet being wrapped around said first projection.

2. An electrical connector according to claim 1 further comprising a second projection located between said bottom surface and said first projection for creating a second space between said bottom surface and said heat-resisting insulating resin sheet.

3. An electrical connector according to claim 1, wherein said contact terminal pins pierces through said heat-resisting insulating resin sheet.

4. An electrical connector according to claim 2, wherein said heat-resisting insulting resin sheet is Kapton tape.

5. An electrical connector according to claim 2, wherein said first space and said second space prevent corrosion due to a cleaning medium after a wash process by substantially promoting evaporation of said cleaning medium.

6. An electrical connector according to claim 1 wherein said heat-resisting insulating resin sheet wraps around said first projection.

7. An electrical connector according to claim 1 wherein said first projection is a ridge located at an end of said bottom surface of said housing.

8. An electrical connector according to claim 1 wherein said heat-resisting insulating resin sheet is larger than said bottom surface, said heat-resisting insulating resin extending at least in one direction beyond said housing at said bottom surface.

9. An electrical connector for connecting a first circuit board with through holes to a second circuit board via a plurality of contact terminal pins, comprising:

a housing located on said first circuit board, said housing having a bottom surface and a top surface, said plurality of contact terminal pins located at said bottom surface of said housing and placed in said through holes of said first circuit board;

a heat-resisting insulating resin sheet located between said bottom surface of said housing and said first circuit board for preventing excess solder from entering into said housing when melted solder is applied to said contact terminal pins; and a first projection located between said bottom surface and said heat-resisting insulating resin sheet for creating a space between said bottom surface and said heat-resisting insulating resin sheet, said space preventing corrosion due to a cleaning medium after a wash process by substantially promoting evaporation of said cleaning medium.

10. An electrical connector for connecting a first circuit board with through holes to a second circuit board via a plurality of contact terminal pins, comprising:

a housing located on said first circuit board, said housing having a bottom surface and a top surface, said plurality of contact terminal pins located at said bottom surface of said housing and placed in said through holes of said first circuit board;

a heat-resisting insulating resin sheet located between said bottom surface of said housing and said first circuit board for preventing excess solder from entering into said housing when melted solder is applied to said contact terminal pins;

a first projection located on said bottom surface of said housing for creating a first space between said heat-resisting insulating resin sheet and said first circuit board, said first space preventing corrosion by providing an escape pathway for a corrosion-causing gas which is formed from said melted solder; and a second projection located between said bottom surface and said first projection for creating a second space between said bottom surface and said heat-resisting insulating resin sheet, said first space and said second space preventing corrosion due to a cleaning medium after a wash process by substantially promoting evaporation of said cleaning medium.

11. An electrical connector according to claim 10 wherein said heat-resisting insulating resin sheet wraps around said first projection.

12. An electrical connector according to claim 10 wherein said first projection is a ridge located at an end of said bottom surface of said housing.

13. An electrical connector according to claim 10 wherein said heat-resisting insulating resin sheet is larger than said bottom surface, said heat-resisting insulating resin extending at least in one direction beyond said housing at said bottom surface.

14. An electrical connector for connecting a first circuit board with through holes to a second circuit board via a plurality of contact terminal pins, comprising:

a housing located on said first circuit board, said housing having a bottom surface and a top surface, said plurality of contact terminal pins located at said bottom surface of said housing and placed in said through holes of said first circuit board;

a heat-resisting insulating resin sheet located between said bottom surface of said housing and said first circuit board for preventing excess solder from entering into said housing when melted solder is applied to said contact terminal pins; and a first projection located on said bottom surface of said housing for creating a first space between said heat-resisting insulating resin sheet and said first circuit board wherein said heat-resisting insulating resin sheet being wrapped around said first projection.

* * * * *